United States Patent
Khemka et al.

(10) Patent No.: US 8,278,710 B2
(45) Date of Patent: Oct. 2, 2012

(54) GUARD RING INTEGRATED LDMOS

(75) Inventors: Vishnu K. Khemka, Phoenix, AZ (US);
Stephen J. Cosentino, Gilbert, AZ (US);
Tahir A. Khan, Tempe, AZ (US);
Adolfo C. Reyes, Tempe, AZ (US);
Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 249 days.

(21) Appl. No.: 12/842,660

(22) Filed: Jul. 23, 2010

(65) Prior Publication Data

US 2012/0018804 A1 Jan. 26, 2012

(51) Int. Cl.
*H01L 29/66* (2006.01)
(52) U.S. Cl. ........ 257/339; 257/335; 257/342; 257/343; 257/349; 257/E29.066; 257/E29.256; 257/E29.261; 257/E21.417; 257/E21.418; 257/E21.427; 438/197; 438/199; 438/207
(58) Field of Classification Search .............. 257/335, 257/339, 342, 343, 349, E29.066, E29.256, 257/E29.261, E21.417, E24.424, E21.424; 438/197, 199, 207
See application file for complete search history.

(56) References Cited

U.S. PATENT DOCUMENTS

| | | | |
|---|---|---|---|
| 5,386,136 A * | 1/1995 | Williams et al. | 257/409 |
| 6,395,593 B1 | 5/2002 | Pendharkar et al. | |
| 6,924,531 B2 | 8/2005 | Chen et al. | |
| 6,933,559 B1 | 8/2005 | Van Roijen et al. | |
| 7,095,092 B2 | 8/2006 | Zhu et al. | |
| 2002/0033508 A1 * | 3/2002 | Morikawa et al. | 257/368 |
| 2008/0164537 A1 * | 7/2008 | Cai | 257/408 |

OTHER PUBLICATIONS

R. Zhu et al, Substrate Majority Carrier-Induced NLDMOSFET Failure and its Prevention in Advanced Smart Power IC Technologies, IEEE Transactions on Device and Materials Reliability, vol. 6, No. 3, Sep. 2006.
R. Zhu et al, Substrate Majority Carrier Induced NLDMOS Failure and its Prevention in Advanced Smart Power Technologies, IEEE 44th Annual International Reliability Physics Symposium, San Jose, 2006.
R. Zhu et al., Implementation of High-Side, High-Voltage RESURF LDMOS in a sub-half Micron Smart Power Technology, ISPSD '01, Proceedings of the 13th International Symposium on Power Semiconductor Devices and ICs, 2001.

* cited by examiner

*Primary Examiner* — A. Sefer
*Assistant Examiner* — Farid Khan
(74) *Attorney, Agent, or Firm* — Hamilton & Terrile, LLP; Michael Rocco Cannatti

(57) ABSTRACT

An LDMOSFET transistor (100) is provided which includes a substrate (101), an epitaxial drift region (104) in which a drain region (116) is formed, a first well region (107) in which a source region (112) is formed, a gate electrode (120) formed adjacent to the source region (112) to define a first channel region (14), and a grounded substrate injection suppression guard structure that includes a patterned buried layer (102) in ohmic contact with an isolation well region (103) formed in a predetermined upper region of the substrate so as to be spaced apart from the first well region (107) and from the drain region (116), where the buried layer (102) is disposed below the first well region (107) but not below the drain region (116).

20 Claims, 4 Drawing Sheets

GUARD RING INTEGRATED LDMOS

BACKGROUND OF THE INVENTION

1. Field of the Invention

The present invention is directed in general to integrated circuit devices and methods for manufacturing same. In one aspect, the present invention relates to the manufacture and use of lateral double diffusion MOS transistor (LDMOSFET) devices.

2. Description of the Related Art

High-voltage integrated circuits applications, such as high-voltage smart power applications, are constructed with integrated circuit MOS field effect transistor devices which must be able to sustain high voltages (e.g., fifty volts or greater) across the transistor device's source, body, gate, and drain terminals. With such high-voltage applications, lateral double diffusion MOS (LDMOS) transistor devices are often used to provide the high-voltage transistor devices. But such LDMOS devices usually require thick and low-doped epitaxial layer, which makes them difficult to integrate with low-voltage circuitry on the same chip. In addition, there are typically tradeoffs posed when integrating LDMOS devices between the on-resistance and breakdown voltage parameters of such devices, where the on-resistance is ideally kept low and the breakdown voltage is ideally kept high. For example, a design for an LDMOS device which increases the device breakdown voltage typically also increases the on-resistance, which is undesirable. There are additional challenges presented with LDMOS devices, include the problem of parasitic substrate injection into the substrate in certain situations and the degradation of the safe operating area (SOA) which is the voltage and current conditions over which the device can be expected to operate without self-damage (e.g., the maximum drain current for a given drain voltage).

Accordingly, a need exists for improved semiconductor devices, especially RESURF type semiconductor devices having improved substrate injection suppression and increased safe operating area, without a corresponding degradation of other important device properties. There is also a need for a high-voltage transistor device and fabrication processes to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
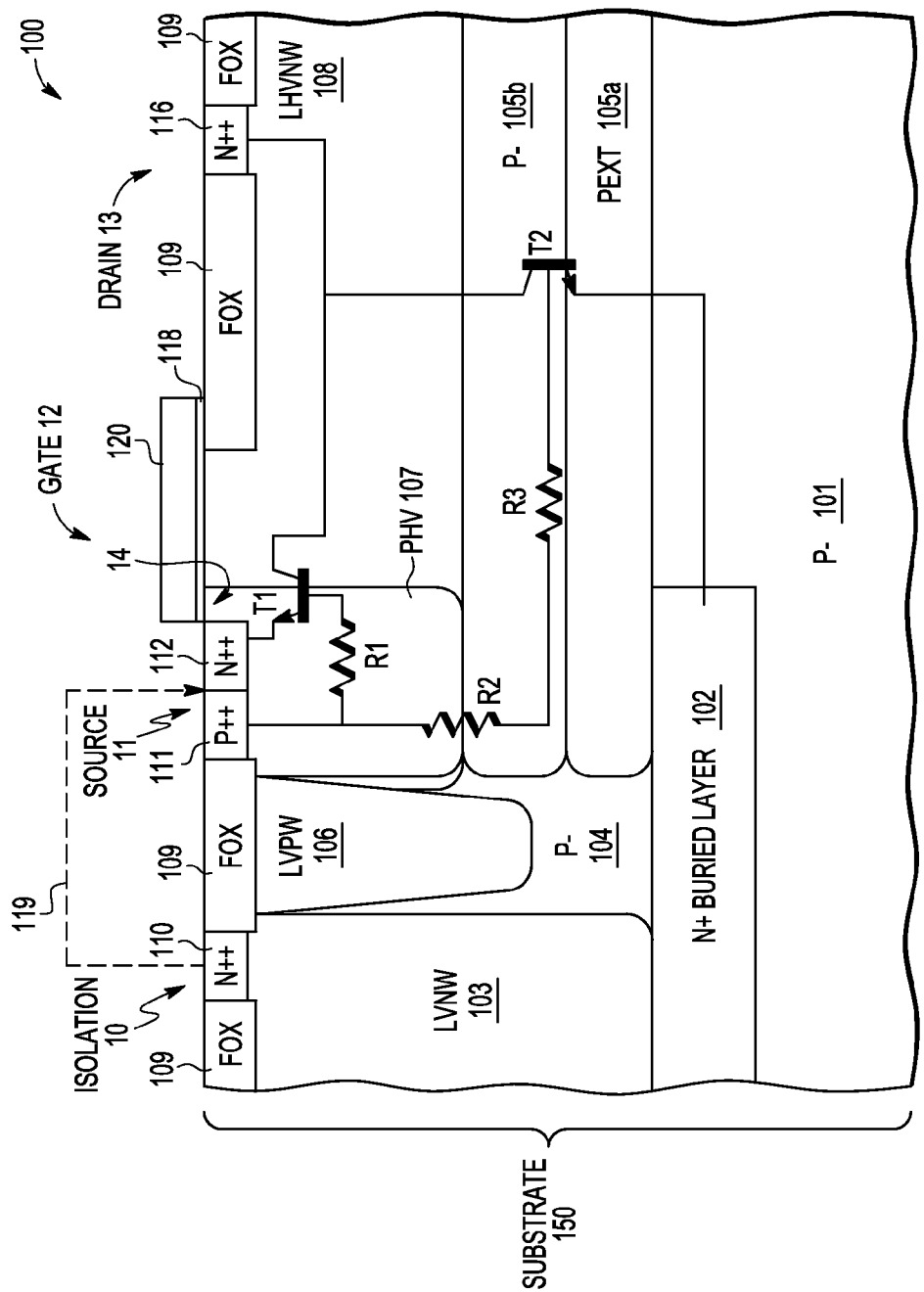
FIG. 1 is a partial cross-sectional view of the insulated RESURF LDMOS device which is formed to provide a grounded substrate injection suppression guard structure under the source and p-body regions but not under the drain region in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

An N-channel laterally diffused MOS (LDMOS) transistor with a grounded substrate injection suppression guard structure is described for use with high voltage (e.g., approximately 50-200V) smart power applications. In selected embodiments, the disclosed LDMOS transistor is formed in a p-type substrate with a grounded integrated guard structure formed with an n-buried layer that is located under the source and p-body regions but not under the drain region so as to provide a guard ring type of protection underneath the p-body region without creating a vertical parasitic bipolar transistor under the drain. When formed with multiple isolated RESURF LDMOS devices in a substrate, the grounded substrate injection suppression guard structure may be formed as a plurality of N-buried finger layers under each p-body region that are connected together in a third dimension so that each N-buried finger layer extends under the p-body region to enhance the guard-ring protection capability, while the absence of N-buried finger layer under the drain suppresses the vertical parasitic bipolar transistor to an extent that it has better than acceptable performance.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

With bulk, non-trench isolation-based technologies, conventional approaches for suppressing substrate injection into the substrate use large heavily doped diffused moats around the device. In other approaches, reduced surface field (RESURF) insulated LDMOS structures can be used to redistribute the field density inside the LDMOS device by enclosing the device inside a heavily doped isolation tub which is grounded or shorted to the source/body of the MOS thus making the device isolated and immune to parasitic substrate injection, but this introduces an extra parasitic bipolar transistor in the device (from the drain to the isolation tub) which is quite weak due to the RESURF charge balance requirement on the drift region, and which limits the safe operating area, thereby increasing yield losses.

FIG. 1 is a partial cross-sectional view of a bulk NLDMOSFET structure 100 in which a reduced surface field (RESURF) LDMOS transistor is isolated with a substrate injection suppression guard structure 102, 103 formed in the substrate 150. The depicted LDMOS structure 100 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). For example, the depicted NLDMOS structure 100 may be formed on or as part of a semiconductor substrate 101 formed of a material having one conductivity type impurities, such as a p-type substrate layer 101, at a predetermined P− doping level (e.g., approximately $1E15$ $cm^{-3}$), though any desired dopant type and/or concentration may be used. Depending on the type of transistor device being fabricated, the semiconductor substrate 101 may be formed from any semiconductor material, including, for example, Si, SiC, SiGe, SiGeC, Ge, GaAs, InAs, InP as well as other III/V or II/VI compound semiconductors or any combination thereof. Although bulk type of substrate is shown here for the description of the invention, the invention is not limited to any specific substrate type. For example, the starting substrate 101 for the invention can be of semiconductor-on-insulator (SOI) type having a buried insulator layer under a top layer of semiconductor. In selected embodiments, an additional semiconductor layer 104 may be formed with the same p-type material and doping level as the p-type substrate layer 101, such as when the N+ buried layer 102 is formed by implantation or the additional semiconductor layer 104 is epitaxially grown from the underlying substrate layer. In such cases, the semiconductor layer 104 may be considered to function as part of the p-type substrate layer 101, thereby forming the substrate 150.

On or in the semiconductor substrate 101/104, an N+ buried layer 102 and n-type sinker well 103 are formed as a substrate injection suppression guard structure that is located under the source region 112 and p-body region 107, but not under the drain region 116. The n-type sinker well 103 may be formed by using an implant mask to selectively diffuse or implant n-type impurities into the p-type substrate 104 to a predetermined implant energy and dopant concentration (e.g., $1E16$ to $1E19$ $cm^{-3}$) so as to be located in an upper portion of the p-type substrate 104 and around the isolation terminal region and spaced apart from the high voltage well region 107. As for each N+ buried layer 102, a different mask and implant sequence is used to selectively implant n-type impurities (e.g., Antimony) into the p-type substrate 101 to a predetermined implant energy and dopant concentration (e.g., $1E18$ to $1E20$ $cm^{-3}$) so as to overlap with the n-type sinker well 103 and extend from the n-type sinker well 103 laterally toward the drain region 116, though not extending so far as be located under the drain region 116. As formed, the substrate injection suppression guard structure 102, 103 is grounded or shorted to the source region 112 at the lowest available reference potential to form a selectively-positioned isolation tub to provide junction isolation during normal MOSFET operation for purposes of suppressing substrate injection by maintaining acceptable isolation while simultaneously suppressing the vertical parasitic bipolar transistor under the drain. As will be appreciated, the N+ buried layer 102 may be a buried layer or may be an N+ layer formed in any manner. N+ sinker well 103 may be implemented as a conductive sinker or in any desired manner, and in combination with N+ buried layer 102, forms a conductive isolation tub or conductive isolation feature which may be used to conductively isolate the NLDMOS structure 100 from the rest of the integrated circuit.

Above the N+ buried layer 102 and in the active area for the NLDMOSFET structure 100, one or more p-type semiconductor layers 105 are formed on or in the semiconductor substrate 101/104 between the first semiconductor region 108 (e.g., VHVNW) and the N+ buried layer 102 to delineate and separate these n-type regions 102, 108 with a p-type layer which may have a different doping concentration than the p-type semiconductor substrate 101/104. For example, the p-type semiconductor layer(s) 105 (PEXT) may be formed with a first p-type layer 105a having a total integrated doping of approximately 1 to $6E12$ $cm^{-2}$, or an epitaxial p-type layer 105 having a thickness in the range of approximately 0.5-2.0 um with a p-type doping concentration of approximately $1E16$ to $1E17$ $cm^{-3}$, though other dopant types, thicknesses, and/or concentrations may be used. In addition, the p-type semiconductor layer(s) 105 may include a p-type layer 105b having a similar or different total integrated doping concentration and/or thickness.

Above the p-type semiconductor layer(s) 105 is formed a first semiconductor region 108 which defines a drift region for the NLDMOS structure 100. In selected embodiments, the first semiconductor region 108 may be formed by using an implant mask to selectively diffuse or implant n-type impurities into the p-type semiconductor region 104 to a predetermined implant energy and dopant concentration. For example, the epitaxial layer 108 may be formed with n-type material having a total integrated doping of approximately $3E12$ $cm^{-2}$, or an epitaxial layer 108 having a thickness in the range of approximately 1-3 um with an n-type doping concentration of approximately $5E14$ to $1E17$ $cm^{-3}$, though other dopant types, thicknesses, and/or concentrations may be used. In these embodiments, the epitaxial layer 108 provides an n-type drift space for the NLDMOS structure 100.

In or adjacent to the epitaxial layer 108, a first high voltage well region 107 (a.k.a., P-body or PHV region) is formed to a predetermined depth of a material having a predetermined conductivity type (e.g., p-type) impurities so as to be located to surround and contain the source region 112. For example, the first high voltage well region 107 may be formed by using an implant mask or other technique to selectively diffuse or implant p-type impurities to a predetermined implant energy and dopant concentration (e.g., $1E16$ to $1E18$ $cm^{-3}$), though other dopant types, thicknesses, and/or concentrations may be used.

In addition, a p-type semiconductor well/layer or low-voltage p-well 106 (a.k.a., LVPW) is formed in or on the semiconductor substrate 101/104 to a predetermined depth with a material having the predetermined conductivity type (e.g., p-type) impurities so as to be formed below the isolation region 109 located between the isolation terminal 10 and source terminal 11. As illustrated, the LVPW 106 may be formed by using an implant mask or other technique to selectively diffuse or implant p-type impurities to a predetermined implant energy and dopant concentration (e.g., 1E17 to 1E19 cm$^{-3}$) so that the LVPW region 106 extends below the PHV region 107, but not down to the N+ buried layer 102.

The semiconductor substrate 101/104 also includes an isolation terminal 10 formed from the N+ region 110, a source terminal 11 formed from N+ region 112, a gate electrode 12 formed from the gate dielectric layer 118 and conductive layer 120, and a drain terminal 13 formed from the N+ region 116. As depicted, a first source region 112 is formed of a material having different conductivity type impurities (e.g., N++ source region) in a predetermined upper region of the first high voltage well region 107. In addition, a first body contact region 111 is formed of a material having the predetermined conductivity type impurities (e.g., P++ body contact region) so as to be adjacent to the first source region 112 in the first high voltage well region 107. The body contact region 111 is the "back gate" or "body" region that is shorted to the first source region 112 to improve device robustness. Finally, a first drain region 116 is formed of a material having different conductivity type impurities (e.g., N++ drain region) in a predetermined upper region of the epitaxial layer 108 so as to be located a predetermined distance away from the source region 112. Though the body, the source, and the drain regions 111, 112, 116 can be formed using photoresist implant masks to selectively diffuse or implant the appropriate impurities into the epitaxial layer 108 or well region 107, it will be appreciated that other masking or selective diffusion or implantation techniques may also be used. The regions 110-112 and 116 are all heavily doped in order to allow for good ohmic contact, and thus may be called ohmic regions on which metal contacts (not shown) may be formed. With this configuration, the P− substrate layer 101/104 includes an N-type semiconductor well/layer 108 (in which the drain 13 is formed), a p-type semiconductor well/layer or low-voltage p-well (LVPW) 106 (formed below the insulating isolation region 109 located between the isolation terminal 10 and source terminal 11), and a p-type semiconductor well/layer or PHV well 107 (in which the source 11 is formed). The depicted p-well 107 also forms the body of NLDMOSFET in which the gate channel region 14 is formed, and its surface concentration sets the threshold voltage for the device. In addition, the N+ region 116 and n-well 108 (e.g., a very high voltage n-well) together form the drain of the device which, along with the p-region 105 under the n-well 108 and N+ buried layer 102, creates the desired RESURF action.

In the depicted NLDMOS structure 100, there is an inherent body diode (not shown) formed between the p-well 107 and n-well 108. In addition, there is a lateral n-p-n transistor T1 to the basic MOSFET structure formed by n+ source 112 as emitter, p-well 107 as base, and n-well 108 as collector. In addition, a vertical n-p-n transistor T2 is introduced which is formed having the N+ buried layer 102 as an emitter, the p-type layers 101, 105 as base, and the n-well 108 as the collector. However, by remotely placing the NBL layer 102 away from the drain 116, the vertical n-p-n transistor T2 is suppressed, at least as compared to other configurations where the N+ buried layer 102 extends across the entirety of the NLDMOS structure 100 (including under the drain 116).

Over the exposed p-well 107 and n-well 108 regions in the substrate 101/104, a gate electrode structure is formed by sequentially forming a gate insulating layer 118 and a gate electrode layer 120 between the source 11 and drain 13, and then patterning and etching the layers 118, 120 to form the gate electrode structure 118, 120. While any desired materials may be used, a thin oxide layer may be used to form the gate dielectric layer 118, and the conductive layer 120 may be formed using a conductive or semi-conductive material or combination thereof, such as a layer of one or more polysilicon and or metal layers. In addition, field oxide region(s) 109 may be formed to surround and isolate the NLDMOS structure 100. Though illustrated as field oxide regions, it will be appreciated that shallow trench isolation regions may also be used, or any other desired dielectric material which forms an electrical isolation barrier for electrically isolating the NLDMOS structure 100 from the rest of the integrated circuit. As formed, the gate electrode structure 118, 120 is positioned to be adjacent to the source region 112, to cover part of the p-type high voltage well region 107, and to completely cover the exposed n-type well region 108 and at least part of the field oxide region 109 formed adjacent to the drain region 116.

With the NLDMOS structure 100 shown in FIG. 1, the traditional guard-ring moat that is typically located below the entirety of the MOSFET device is replaced with a truncated guard-ring element composed of the LVNW isolation sinker implant 103 with the NBL layer 102 located under only the p-body region 107 and source 112 and part of the gate 120, but not underneath the drain 116. By locating the NBL layer 102 under the p-body region 107, guard-ring type isolation against substrate injection is provided. However, by eliminating the NBL layer 102 from beneath the drain 116 and reducing the extent of the NBL layer 102 under the n-type well region 108, the vertical parasitic bipolar transistor T2 is reduced to an extent that it has better than acceptable performance. In particular, the elimination of the NBL layer beneath the drain region does not appreciably change the potential contours or breakdown voltage for single RESURF NLDMOS transistors, and is therefore inconsequential to the device breakdown performance. In addition, for RESURF NLDMOS transistors having an operating voltage of approximately 3V across gate-to-source terminals (Vgs), a significant improvement in the safe operation area is expected before breakdown occurs.

Figure 2:
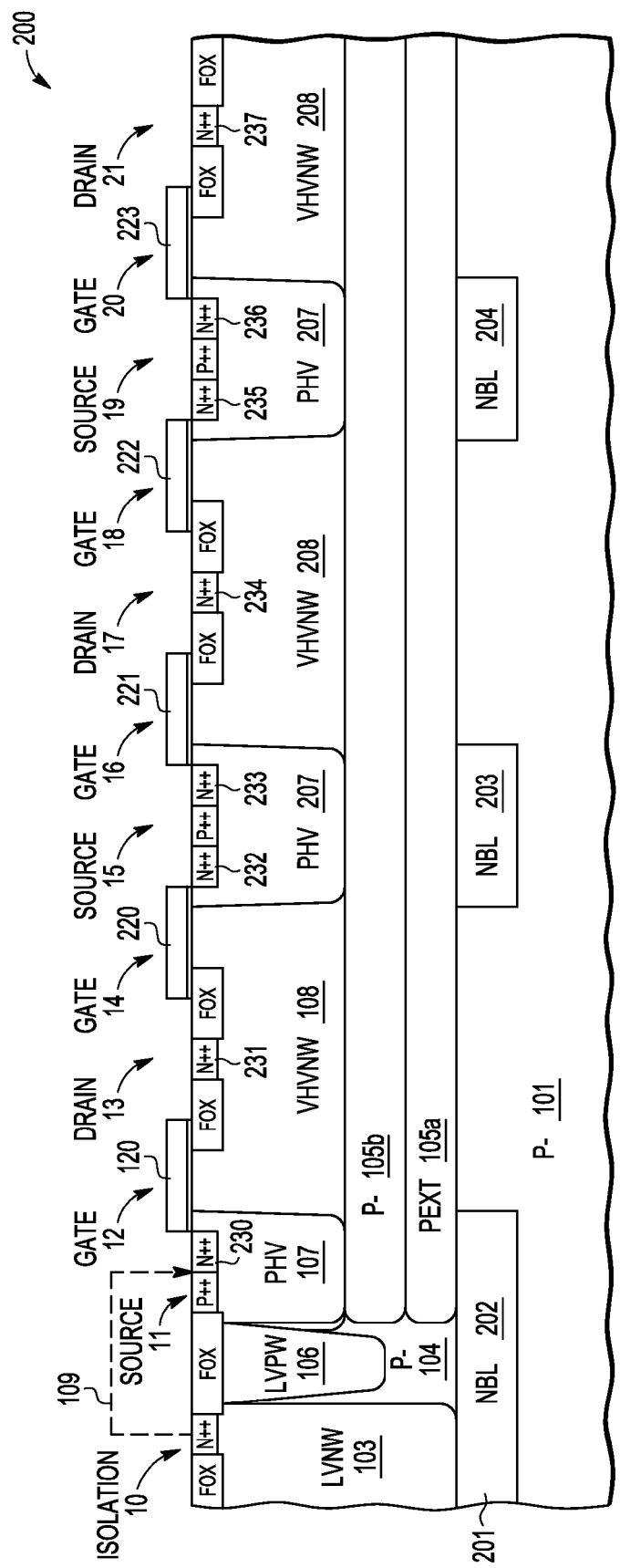
FIG. 2 is a partial cross-sectional view of five sequentially connected RESURF LDMOS transistor devices such as shown in FIG. 1 implemented in a single substrate with a grounded substrate injection suppression guard structure under the source and p-body regions but not under the drain regions in accordance with selected embodiments of the present invention.

This layout and positioning of the NBL layer 102 may be exploited to form a plurality of NLDMOS structures 200 with shared guard-ring elements. For example, FIG. 2 depicts a partial cross-sectional view of five sequentially connected RESURF LDMOS transistor devices such as shown in FIG. 1 implemented in a single p-type substrate 101/104 in which low voltage n-well 103, p-type semiconductor layer(s) 105, low voltage p-well 106, high voltage p-wells 107/207, and very high voltage n-wells 108/208 are formed. In the active substrate area, there is formed a first NLDMOS structure 11/12/13 (with N+ source 230, gate 120 and N+ drain 231), a second NLDMOS structure 13/14/15 (with shared N+ drain 231, gate 220 and N+ source 232), a third NLDMOS structure 15/16/17 (with N+ source 233, gate 221 and N+ drain 234), a fourth NLDMOS structure 17/18/19 (with shared N+ drain 234, gate 222 and N+ source 235), and a fifth NLDMOS structure 19/20/21 (with N+ source 236, gate 223 and N+ drain 237). Connected in parallel, the NLDMOS transistor structures are arrayed in the active area over the p-type semiconductor layer(s) 105 with the sources formed in the high voltage p-wells 107/207, and the drains formed in the very high voltage n-wells 108/208 and surrounded by field oxide (FOX) isolation regions.

With the traditional NLDMOS structure, the extension of a single continuous guard-ring moat below all of the NLDMOS devices would create a large base resistance, particularly for the NLDMOS devices (e.g., the fifth NLDMOS structure 19/20/21) located furthest away from the n-type isolation sinker well 103. With the higher base resistance at the drain(s) of the remote device(s), the vertical bipolar junction transistor T2 below the drain(s) is more easily triggered, thereby reducing the safe operating area and reducing device performance. These drawbacks are addressed by selected embodiments of the present invention which integrate the grounded substrate injection suppression guard structure to include grounded NBL elements that are located under the source and p-body regions but not under the drain regions, thereby extending the guard ring protection multiple NLDMOS devices while suppressing the additional vertical parasitic n-p-n transistor that would otherwise be formed if the NBL elements were located directly below the drain regions. FIG. 2 depicts an example configuration of the grounded substrate injection suppression guard structure 201 which includes discretely positioned NBL elements 202-204. As depicted, the substrate injection suppression guard structure 201 includes a first NBL element 202 arrayed to extend from the n-type isolation sinker well 103 and terminate below the PHV region 107 containing the source region 230. The substrate injection suppression guard structure 201 also includes a second NBL element 203 arrayed below the PHV region 207 containing the source regions 232, 233, as well as a third NBL element 204 arrayed below the PHV region 207 containing the source regions 235, 236. While the alignment of the terminal end(s) of each NBL element with the edge(s) of the PHV region(s) is not crucial, it will be appreciated that there will be a tradeoff between improvements in the safe operating area and reduced substrate injection suppression as the NBL elements are pulled back from the drain regions. In selected embodiments, the terminal end of each NBL element is aligned under both the gate and the PHV region for a given source region, and in other embodiments, the terminal end of each NBL element is substantially aligned with the PHV region edge for a given source region (e.g., to within 10-15% of the width of the PHV region).

Figure 3:
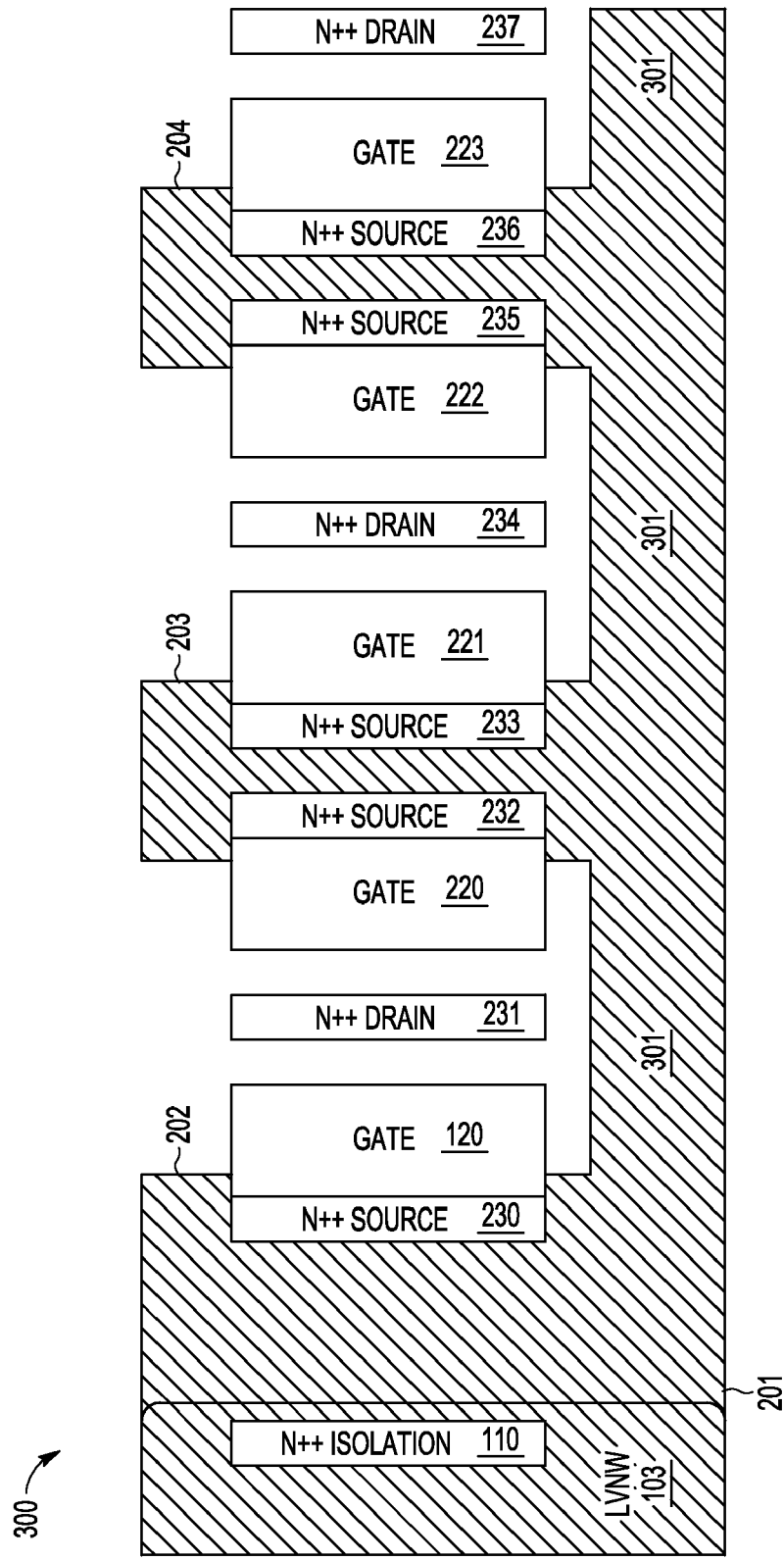
FIG. 3 is a plan view of the sequentially connected RESURF LDMOS transistor devices such as shown in FIG. 2.

To physically and/or electrically connect the NBL elements 202-204 into a single guard structure 201, the NBL elements 202-204 may be connected together with a connection or wrap-around component 301 arrayed on one or more ends of the NBL elements 202-204. As an example implementation, FIG. 3 provides a plan view 300 of the sequentially connected NLDMOS transistor devices shown in FIG. 2 where the NBL elements 202-204 are formed as a plurality of conductive finger elements 202-204 which extend from the connection element 301 in a third dimension. In particular, NBL elements 202-204 extend upward (in FIG. 3) from the connection element 301 so as be located beneath at least the N++ source regions 230, 232-233, 235-236 and part of the gates 120, 220, 221, 222, 223, but not the N++ drain regions 231, 234, 237. In addition, the guard structure 201 overlaps with the low voltage n-well region 103 and N++ isolation region 110 for purposes of establishing ohmic contact to a ground or other low reference potential. While FIG. 3 shows that the guard structure 201 may be formed in an "E" or "F" shape with the NBL elements extending as fingers from a connecting element 301 on one side, it will be appreciated that the connecting elements can be located on either or both sides of the NBL finger elements to connect them together in a single electrically conductive guard structure.

Figure 4:
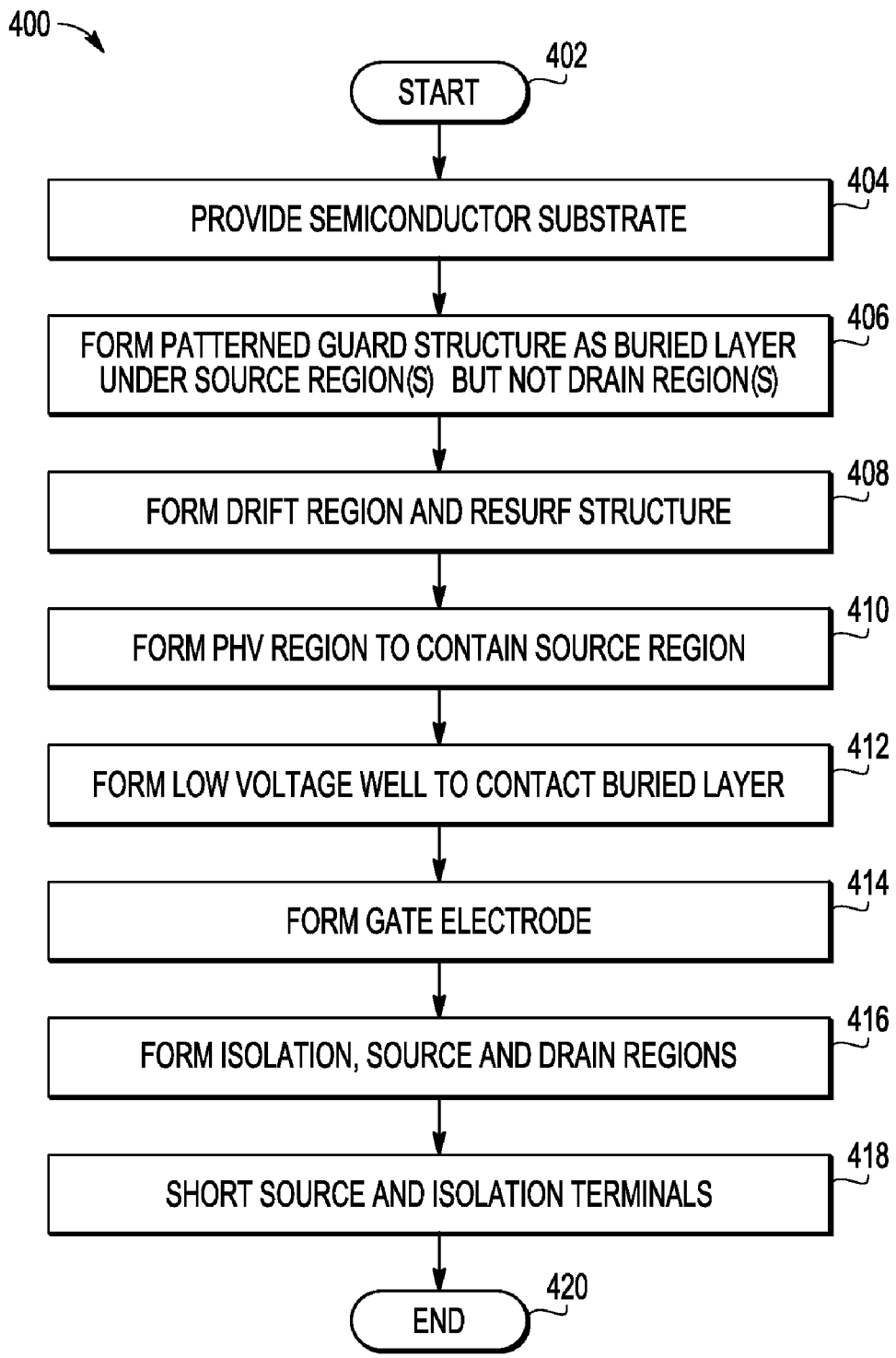
FIG. 4 is a simplified schematic flow chart illustrating a method for fabricating devices in accordance with selected embodiments of the invention.

FIG. 4 is a simplified schematic flow chart illustrating a method 400 for fabricating devices of the type illustrated in FIGS. 1-3 in accordance with selected embodiments of the invention. In describing the fabrication methodology 400, various reference numbers, doping types and concentrations are provided by way of examples of different regions that can be formed, but this is intended merely to facilitate understanding of various exemplary embodiments and not by way of limitation. Once the fabrication methodology starts (step 402), a semiconductor substrate layer is provided having one conductivity type (e.g., p-type) and doping concentration (e.g., approximately $2E15\ cm^{-3}$). Unless otherwise indicated, subsequent steps 404-418 may be provided in any desired order. On or in the semiconductor substrate layer, a substrate injection suppression guard structure may be formed (step 406), such as by forming a patterned buried layer so as to be located in the area(s) of the intended source and p-body regions, but not under the area(s) of the intended drain region (s). As formed, the patterned buried layer has a different conductivity type (e.g., n-type) and a predetermined doping concentration and/or thickness under the source region, though the doping concentration or thickness may decrease with increasing distance toward the drain region. In forming the patterned buried layer, selective masking and implantation or diffusion techniques may be used, or alternatively selective epitaxial growth may be used with controlled doping conditions to form the patterned buried layer.

Above the patterned buried layer, drift region and RESURF structures are formed (step 408). For example, the RESURF structure may be formed by selectively implanting and diffusing a dopant having a predetermined conductivity type (e.g., p-type) at a predetermined total integrated doping (e.g., approximately $5E12\ cm^{-2}$), while the drift region may be formed by selectively implanting and diffusing a dopant having a different conductivity type (e.g., n-type) at a predetermined total integrated doping (e.g., approximately $3E12\ cm^{-2}$). At step 410, a P-body high voltage region (PHV) having the predetermined conductivity type (e.g., p-type) at a predetermined doping concentration (e.g., approximately $2E18\ cm^{-3}$) is formed in or adjacent to the drift region (e.g., by implantation) so as to completely contain the subsequently formed source region. In addition, the patterned guard structure is completed (step 412) by forming (e.g., implanting) a low voltage well region having the different conductivity type (e.g., n-type) at a predetermined doping concentration (e.g., approximately $5E18\ cm^{-3}$) so as to be located below the subsequently formed isolation terminal and extend down to ohmically contact the one or more patterned buried layers.

After forming a gate dielectric layer, a control or gate electrode may be formed (step 414) to overlie part of the P-body region and to extend over part of the drift region. At step 416, isolation regions are formed remotely from the active device area. In addition, source and drain regions are formed proximate to the upper surface of the drift region, such as by implanting impurities of a different conductivity type (e.g., N-type) at a predetermined doping concentration (e.g., N++), where the source region is located to be completely contained within the P-body region, and the drain region is located to be spaced apart from the P-body region. In addition, a source contact region may be formed adjacent to the source region with a material of the predetermined conductivity type (e.g., P-type) at a predetermined doping concentration (e.g., P++). Finally, the source and isolation terminals are shorted together, such as by forming connecting metallization layer(s) between the source and isolation terminals. As depicted, the fabrication methodology 400 ends at step 420.

By now it should be appreciated that there is provided herein a laterally diffused MOS semiconductor device and method for fabricating same. The disclosed semiconductor device is formed over a semiconductor substrate of a first conductivity type (e.g., p-type), and includes a first semiconductor region of a second, different conductivity type (e.g., an n-type drift region) formed over the semiconductor substrate (e.g., by epitaxial growth). A first well region of the first conductivity type (e.g., a p-type high voltage region) formed in the substrate adjacent to the first semiconductor region surrounds a first source region of the second conductivity type formed in a predetermined upper region of the first well region. In a predetermined upper surface region of the first semiconductor region, a drain region of the second conductivity type is formed so as to be spaced a predetermined distance from the first well region and surrounded by the first semiconductor region. By forming a gate electrode and a gate insulating layer over part of the first well region and substantially adjacent to the source region, a first channel region is defined inside the first well region. A substrate injection suppression feature of the second conductivity type is formed in the substrate to include a buried layer and a conductive vertical portion conductively coupled to the buried layer, wherein the buried layer is disposed below the first well region but not below the drain region. As formed, the buried layer has a terminal end that may be substantially aligned with an edge of the first well region that is located between the source and drain regions, and may be formed with arsenic having a dopant concentration on the order of 5E14 to 5E16, though other dopants and concentrations may be used. In selected embodiments, an isolation region formed at the surface of the substrate is surrounded by the conductive vertical portion which extends from the surface down to the buried layer. By electrically shorting the isolation region to the source region, the substrate injection suppression feature and source are held at the same (low) reference potential. In operation, the grounded substrate injection suppression feature suppresses substrate injection from the drain region and controls an amount of parasitic current injected into the substrate from a parasitic vertical NPN transistor formed with the drain region.

In another form, there is provided a method for forming a semiconductor device. In the disclosed methodology, a semiconductor substrate of a first conductivity type is provided, and then the following steps are conducted in any desired order. On or in the semiconductor substrate, a first body region of the first conductivity type is formed (e.g., by implantation) that is disposed to surround a designated source region area, and a first source region of a second conductivity type is then formed (e.g., by implantation) in the first body region. In addition, a semiconductor drift layer of the second conductivity type is formed (e.g., by epitaxial growth) on or in the semiconductor substrate to be disposed adjacent to the first body region and to surround the designated drain region area. In the semiconductor drift layer, a drain region of the second conductivity type is formed (e.g., by implantation) to be spaced a predetermined distance from the first body region. A buried substrate injection suppression layer of the second conductivity type is also formed in the semiconductor substrate (e.g., by implantation) to be disposed under at least the first body region but not under the designated drain region area. In selected embodiments, the buried substrate injection suppression layer is formed by patterning a first implant mask over the semiconductor substrate to have an opening to overlap with at least the first body region but not with the designated drain region area, then implanting impurities into the semiconductor substrate to form the buried substrate injection suppression layer using the first patterned implant mask as a mask for ion implantation. In other embodiments, the buried substrate injection suppression layer is formed by selectively implanting one or more buried layers having a first overall lateral extent that is substantially parallel to an upper surface of the semiconductor surface and that substantially aligns with an edge of the first body region that is located between the source and drain regions. In a predetermined upper region of the semiconductor substrate, a conductive well region of the second conductivity type is formed that is conductively coupled to the buried substrate injection suppression layer. In selected embodiments, the conductive well region layer is formed by patterning a second implant mask over the semiconductor substrate to have an opening to overlap with a portion of the buried substrate injection suppression layer, and then implanting impurities into the semiconductor substrate to form the conductive well region layer using the second patterned implant mask as a mask for ion implantation. Lastly, a gate electrode is formed over at least part of the first body region and semiconductor drift layer that is disposed substantially adjacent to the source region, thereby defining a first channel region inside the first body region, and one or more conductive layers are then formed over the semiconductor substrate to electrically connect the source region to an isolation terminal of the second conductivity type formed in the conductive well region layer.

In yet another form, there is provided a semiconductor device and method for manufacturing same. As formed, the semiconductor device includes a substrate of a first conductivity type, along with one or more source regions of a second conductivity type different from the first conductivity type, one or more gate electrodes located over the substrate so that each gate electrode is disposed adjacent to a corresponding source region, and one or more drain regions of the second conductivity type so that each drain region is disposed adjacent to a corresponding gate electrode. In addition, the semiconductor device includes a conductive isolation feature of the second conductivity type, wherein the conductive isolation feature includes one or more buried layers and a sinker well conductively coupled to the one or more buried layers, wherein each of the one or more buried layers is disposed below the one or more source regions but not below the one or more drain regions. The semiconductor device also includes one or more body regions of the first conductivity type disposed in the substrate to surround the one or more source regions, and one or more drift regions of the second conductivity type disposed in the substrate to surround the one or more drain regions. The conductive isolation feature may be implemented with one or more buried finger layers extending under the one or more source regions, but not under the one or more drain regions, to form a single conductive substrate injection suppression feature that suppresses substrate injection from the one or more drain regions and suppresses a vertical parasitic bipolar transistor. Finally, the semiconductor device includes a gate dielectric overlying a region between the source region and drain region, a conductive layer overlying the dielectric, and a conductive isolation region formed in the sinker well, wherein the conductive isolation region is electrically coupled to the source region.

Although the described exemplary embodiments disclosed herein are directed to various isolated RESURF LDMOS transistors and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are for N-channel LDMOS transistor devices or the like, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conduction type. Moreover, the thicknesses and doping concentrations of the described layers may deviate from the disclosed ranges or values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
a substrate of a first conductivity type;
a first semiconductor region of a second conductivity type different from the first conductivity type located in the substrate;
a first well region of the first conductivity type located in the substrate adjacent to the first semiconductor region;
a first source region of the second conductivity type located in a predetermined upper region of the first well region;
a drain region of the second conductivity type located in a predetermined upper region of the first semiconductor region, the drain region being spaced a predetermined distance from the first well region;
a gate electrode located over a gate insulating layer and having an edge substantially aligned with an edge of the source region, thereby defining a first channel region inside the first well region; and
a substrate injection suppression feature of the second conductivity type located in the substrate, wherein the substrate injection suppression feature comprises a buried layer and a conductive vertical portion conductively coupled to the buried layer, wherein the buried layer is disposed below the first well region but not below the drain region.

2. The device of claim 1, where the first conductivity type impurities comprise p-type impurities, and the second conductivity type impurities comprise n-type impurities.

3. The device of claim 1, wherein the first semiconductor region comprises an n-type drift region located at the substrate surface to surround the drain region.

4. The device of claim 1, wherein the first semiconductor region comprises an n-type epitaxial layer.

5. The device of claim 1, where the first well region comprises a p-type high voltage region located at the substrate surface to surround the source region.

6. The device of claim 1, further comprising a conductive isolation region located at the substrate surface and surrounded by the conductive vertical portion.

7. The device of claim 6, where the conductive isolation region is electrically shorted to the source region.

8. The device of claim 1, where the buried layer from the substrate injection suppression feature has a terminal end that is substantially aligned with an edge of the first well region that is located between the source and drain regions.

9. The device of claim 1, where the buried layer from the substrate injection suppression feature has a dopant charge density on the order of 5E14 to 5E16 $cm^{-2}$.

10. The device of claim 1, wherein the conductive vertical portion extends from a surface of the region down to the buried layer.

11. The device of claim 1, where the substrate injection suppression feature suppresses substrate injection from the drain region and controls an amount of parasitic current injected into the substrate from a parasitic vertical NPN transistor formed with the drain region.

12. A method for forming a semiconductor device, comprising in any order:
forming in a semiconductor substrate a first body region of a first conductivity type that is disposed to surround a designated source region area;
forming in the first body region a first source region of a second conductivity type different from the first conductivity type;
forming in the semiconductor substrate a semiconductor drift layer of the second conductivity type that is disposed adjacent to the first body region to surround a designated drain region area;
forming in the semiconductor drift layer a drain region of the second conductivity type, the drain region being spaced a predetermined distance from the first body region;
forming in the semiconductor substrate a buried substrate injection suppression layer of the second conductivity type, where the buried layer is disposed under at least the first body region but not under the designated drain region area;
forming in the semiconductor substrate a conductive well region of the second conductivity type that is conductively coupled to the buried substrate injection suppression layer; and
forming a gate electrode over at least part of the first body region and semiconductor drift layer that is disposed substantially adjacent to the source region, thereby defining a first channel region inside the first body region.

13. The method of claim 12, where forming the buried substrate injection suppression layer comprises:
forming a first patterned implant mask over the semiconductor substrate that is patterned to have an opening to overlap with at least the first body region but not with the designated drain region area; and
implanting impurities into the semiconductor substrate to form the buried substrate injection suppression layer using the first patterned implant mask as a mask for ion implantation.

14. The method of claim 13, where forming the conductive well region layer comprises:
forming a second patterned implant mask over the semiconductor substrate that is patterned to have an opening to overlap with a portion of the buried substrate injection suppression layer; and implanting impurities into the semiconductor substrate to form the conductive well region layer using the second patterned implant mask as a mask for ion implantation.

15. The method of claim 12, where forming the buried substrate injection suppression layer comprises selectively implanting one or more buried layers having a first overall lateral extent that is substantially parallel to the substrate surface and that substantially aligns with an edge of the first body region that is located between the source and drain regions.

16. The method of claim 12, further comprising forming one or more conductive layers over the semiconductor substrate to electrically connect the source region to an isolation terminal of the second conductivity type formed in the conductive well region layer.

17. A semiconductor device, comprising:
one or more source regions of a first conductivity type located in a substrate of a second conductivity type different from the first conductivity type;
one or more gate electrodes located over the substrate, each gate electrode being disposed adjacent to a corresponding source region;
one or more drain regions of the first conductivity type, each drain region being disposed adjacent to a corresponding gate electrode; and
a conductive isolation feature of the first conductivity type, wherein the conductive isolation feature includes one or more buried layers and a sinker well conductively coupled to the one or more buried layers, wherein each of the one or more buried layers is disposed below the one or more source regions but not below the one or more drain regions.

18. The device of claim 17, further comprising:
one or more body regions of the second conductivity type disposed in the substrate to surround the one or more source regions; and
one or more drift regions of the first conductivity type disposed in the substrate to surround the one or more drain regions.

19. The device of claim 18, where the conductive isolation feature comprises one or more buried finger layers extending under the one or more source regions but not under the one or more drain regions to form a single conductive substrate injection suppression feature that suppresses substrate injection from the one or more drain regions and suppresses a vertical parasitic bipolar transistor.

20. The device of claim 19, further comprising a conductive isolation region formed in the sinker well, wherein the conductive isolation region is electrically coupled to one or more source regions.

* * * * *